United States Patent
Kong et al.

(10) Patent No.: US 10,982,782 B2
(45) Date of Patent: Apr. 20, 2021

(54) VALVE APPARATUS

(71) Applicant: Samsung Electronics Co., Ltd., Suwon-si (KR)

(72) Inventors: Dae Wee Kong, Yongin-si (KR); Se Jin Kyung, Seoul (KR); Chul Hwan Choi, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 35 days.

(21) Appl. No.: 16/544,513

(22) Filed: Aug. 19, 2019

(65) Prior Publication Data

US 2020/0149642 A1    May 14, 2020

(30) Foreign Application Priority Data

Nov. 9, 2018    (KR) .................. 10-2018-0137185

(51) Int. Cl.
   *F16K 11/10* (2006.01)
   *F15D 1/02* (2006.01)

(52) U.S. Cl.
   CPC .............. *F16K 11/10* (2013.01); *F15D 1/02* (2013.01); *Y10T 137/86493* (2015.04)

(58) Field of Classification Search
   CPC ................................. F16K 11/10; F15D 1/02
   See application file for complete search history.

(56) References Cited

U.S. PATENT DOCUMENTS

| | | | |
|---|---|---|---|
| 3,791,103 A * | 2/1974 | Kusano | B01D 53/48 95/137 |
| 4,108,602 A | 8/1978 | Hanson et al. | |
| 7,699,070 B2 | 4/2010 | Suzuki et al. | |
| 9,212,755 B2 | 12/2015 | Kuriki et al. | |
| 9,803,765 B2 | 10/2017 | Inaba | |
| 2009/0127188 A1* | 5/2009 | Yamasaki | B01D 61/18 210/605 |
| 2010/0115839 A1 | 5/2010 | Brown et al. | |
| 2010/0122521 A1 | 5/2010 | Sun et al. | |
| 2010/0274068 A1* | 10/2010 | Chung | C02F 1/048 588/320 |
| 2017/0292619 A1* | 10/2017 | Lee | F16L 55/1133 |

FOREIGN PATENT DOCUMENTS

| | | |
|---|---|---|
| JP | 3387630 B2 | 3/2003 |
| JP | 3767897 B2 | 4/2006 |
| JP | 2007-139196 A | 6/2007 |
| JP | 5274518 B2 | 8/2013 |
| JP | 6134285 B2 | 4/2017 |
| KR | 10-0840866 B1 | 6/2008 |

* cited by examiner

*Primary Examiner* — Kevin R Barss
(74) *Attorney, Agent, or Firm* — Muir Patent Law, PLLC (57) ABSTRACT

A valve apparatus includes a valve block with a main flow path, a first valve installed on the valve block and connected to the main flow path so that when the first valve turns on, a first fluid is supplied from the main flow path to a process chamber via the first valve, and a second valve installed on the valve block and connected to the main flow path so that when the first valve turns off and the second valve turns on, a second fluid is supplied from the main flow path to a waste gas treatment system via the second valve. The main flow path is disposed parallel to a central axis passing through a center of the valve block and two opposing surfaces of the valve block perpendicularly thereto. The main flow path is disposed to be offset from the central axis toward the first valve.

19 Claims, 10 Drawing Sheets

VALVE APPARATUS

CROSS-REFERENCE TO RELATED APPLICATION

This application claims priority under 35 U.S.C. § 119 to Korean Patent Application No. 10-2018-0137185, filed on Nov. 9, 2018 in the Korean Intellectual Property Office, the disclosure of which is incorporated herein by reference in its entirety.

BACKGROUND

1. Field

The present inventive concept relates to a valve apparatus.

2. Description of Related Art

Semiconductor reaction chambers are provided with valve devices for efficiently controlling a plurality of gas feeds with limited flow paths and valves. However, internal flow paths may have dead zones of gas due to structural constraints. Trapped gas in the dead zones may react with another gas if the trapped gas remains in the flow paths and valves without sufficiently being removed or purged before the supply of another gas. Thus, a reaction residue may occur due to a reaction between the gases. Therefore, it is important to develop a structure with reduced gas dead zones.

SUMMARY

The present inventive concept is to provide a valve apparatus capable of reducing a dead zone.

According to an exemplary embodiment of the present inventive concept, a valve apparatus includes a valve block that is provided with a main flow path, a first valve installed on the valve block and connected to the main flow path so that when the first valve turns on, a first fluid is supplied from the main flow path to a process chamber via the first valve, and a second valve installed on the valve block and connected to the main flow path so that when the first valve turns off and the second valve turns on, a second fluid is supplied from the main flow path to a waste gas treatment system via the second valve. The main flow path is disposed parallel to a central axis passing through a center of the valve block and passing through two opposing surfaces of the valve block perpendicularly thereto. The main flow path is disposed to be offset from the central axis toward the first valve.

According to an exemplary embodiment of the present inventive concept, a valve apparatus includes a valve block including a main flow path, a first valve installed on the valve block and selectively supplying a first fluid from the main flow path to a process chamber, a second valve installed on the valve block, and a flow path for connection arranged in the upstream side of the second valve. The first valve is connected to the main flow path and an upstream side of the second valve. The first valve is directly connected to both the main flow path and the flow path for connection. The flow path for connection connects the main flow path and the second valve to each other so that a second fluid flows from the main flow path to the second valve through the flow path for connection to purge a remaining fluid of the first fluid in the main flow path and the first valve.

According to an exemplary embodiment of the present inventive concept, a valve apparatus includes a valve block having a main flow path, a first valve installed on the valve block, wherein a fluid is selectively supplied via the first valve from the main flow path to a process chamber, and a second valve installed on the valve block. A remaining gas of the fluid in the first valve, after the first valve turns off, is discharged via the second valve to a waste gas treatment system. The first valve is connected to the main flow path and an upstream side of the second valve.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
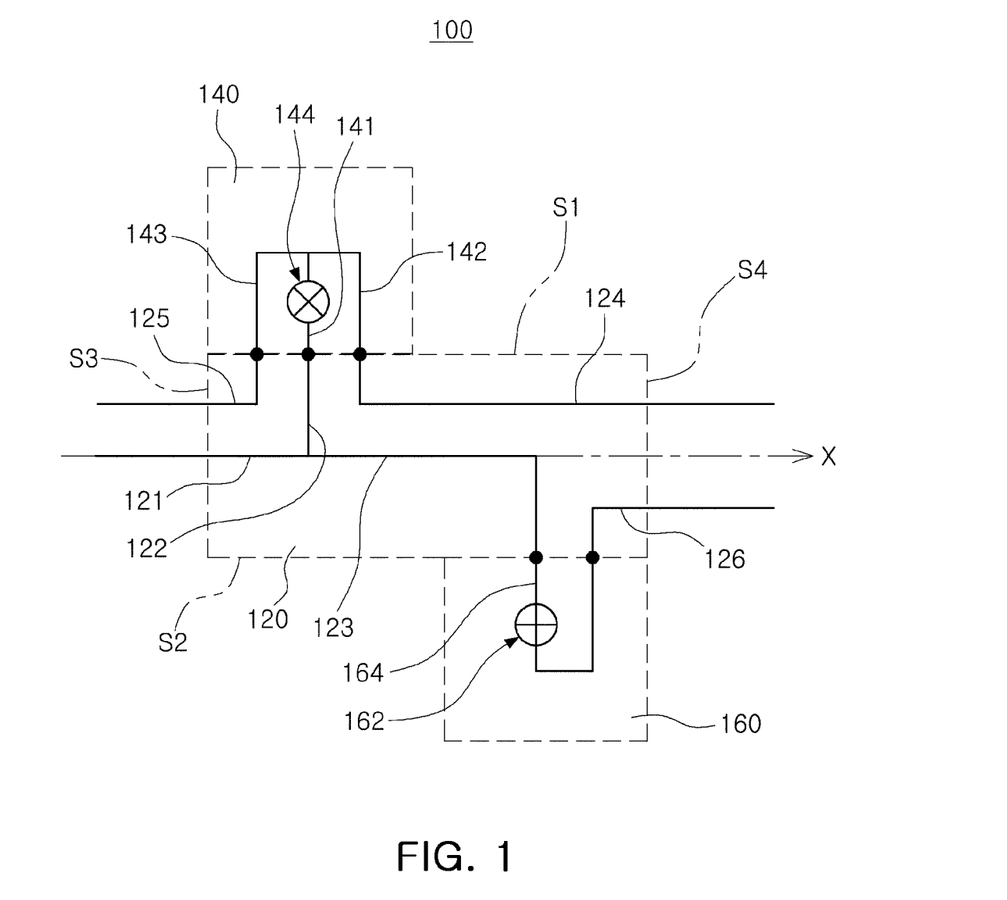
FIG. 1 is a schematic view illustrating a valve apparatus according to a first embodiment of the present inventive concept.
Figure 2:
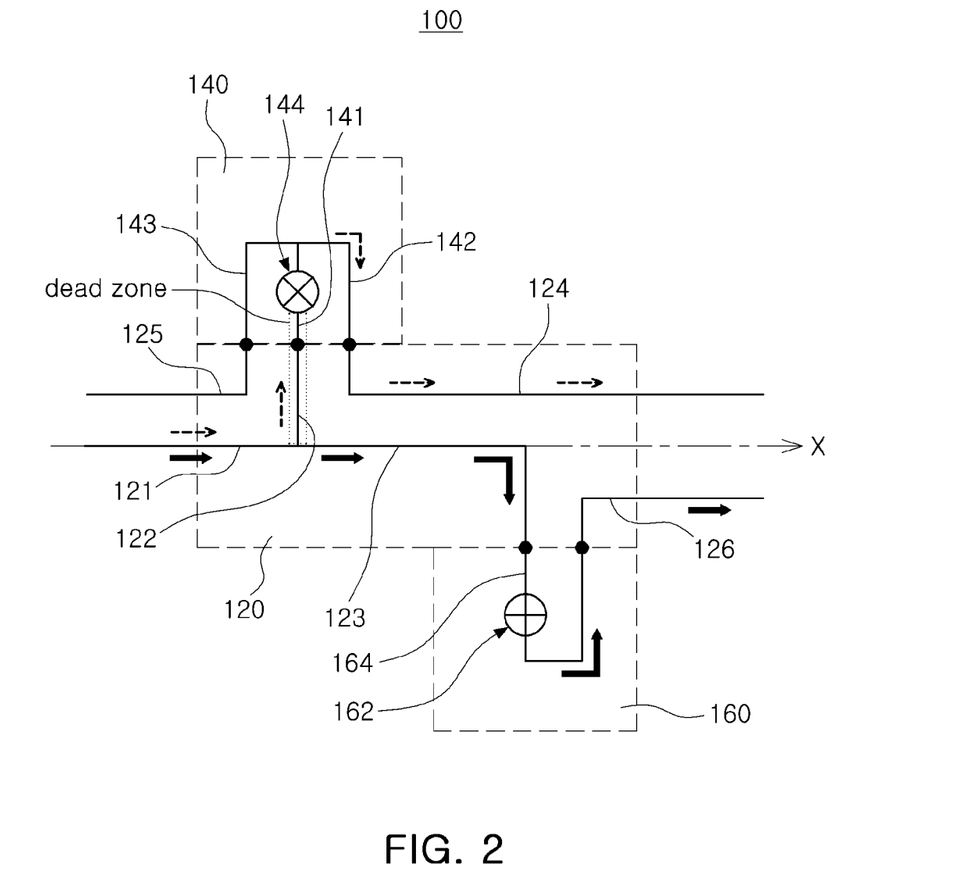
FIG. 2 is a view illustrating flow of a fluid in the valve apparatus according to the first embodiment of the present inventive concept.

FIG. 1 is a schematic view illustrating a valve apparatus according to a first embodiment. FIG. 2 is a view illustrating flow of a fluid in the valve apparatus according to the first embodiment.

Referring to FIG. 1, a valve apparatus 100 includes, for example, a valve block 120, a first valve 140, and a second valve 160.

The first valve 140 and the second valve 160 are connected to the valve block 120, and a plurality of flow paths may be formed in the valve block 120. As an example, a main flow path 121 through which a fluid is supplied to a process chamber is provided in the valve block 120. The main flow path 121 is disposed on an axis passing through a center of the valve block 120 and passing through two opposing surfaces of the valve block 120 perpendicularly thereto, for example, on an X axis. As an example, the valve block 120 may have a hexahedral shape.

The main flow path 121 may branch in the valve block 120. A first connection passage 122 branching from the main flow path 121 is connected to the first valve 140, and a second connection passage 123 branching from the main flow path 121 is connected to the second valve 160. For example, the main flow path 121 is directly connected to both the first connection passage 122 and the second connection passage 123. More specifically, a first end of the first connection passage 122 is directly connected to the first valve 140 and a second end of the first connection passage 122 is directly connected to both the main flow path 121 and a first end of the second connection passage 123. A second end of the second connection passage 123 is directly connected to the second valve 160.

In the valve block 120, a first-first flow path 124 and a first-second flow path 125, connected to the first valve 140, are provided. In addition, in the valve block 120, a second-first flow path 126 are provided to be connected to the second valve 160.

At least one of the first-first flow path 124 and the first-second flow path 125 may be connected to the process chamber (not shown).

The first valve 140 is installed on the valve block 120, and is connected to the first connection passage 122, the first-first flow path 124 and the first-second flow path 125 that are provided in the valve block 120. For example, the first valve 140 includes an inlet flow path 141 that is connected to the first connection passage 122, and outlet flow paths 142 and 143 branching from an end of the inlet flow path 141. The outlet flow paths 142 and 143 are connected to the first-first flow path 124 and the first-second flow path 125, respectively. As an example, the first valve 140 may be used as a downstream valve. The first valve 140 may include a valve body 144 having a diaphragm (not shown) and an actuator (not shown) as a diaphragm valve, for example. The valve body 144 may be configured to connect the inlet flow path 141 to at least one of the outlet flow paths 142 and 143, or to prevent the inlet flow path 141 from being connected to the outlet flow paths 142 and 143.

The second valve 160 is installed on the valve block 120 to be spaced apart from the first valve 140. As an example, the first valve 140 and the second valve 160 are installed on one of two opposing surfaces of the valve block 120 and the other thereof, respectively. The second valve 160 is connected to the second connection passage 123 and the second-first flow path 126 that are provided in the valve block 120. The second-first flow path 126 may be connected to a waste gas treatment system (not shown here) to safely remove a purged gas delivered through the second valve 160. For example, the waste gas treatment system may include a burn/wet system, a gas scrubber or an electrostatic filter. As an example, the second valve 160 may be used as a diverter valve. Also, the second valve 160 may include a valve body 162 having a diaphragm (not shown) and an actuator (not shown) as a diaphragm valve, for example.

The second valve 160 includes an inlet flow path 164 connected to the second connection passage 123 and disposed on a central axis of the second valve 160. For example, the first valve 140 is disposed on a third surface S3 of the valve block 120 and the second valve 150 is disposed on a fourth surface S4 of the valve block 120. Each of the third surface S3 and the fourth surface S4 connects the first surface S1 to the second surface S2 to define the valve block 120 that accommodates the main flow path 121 and the second connection passage 123 and supports the first valve 140 and the second valve 160.

The second valve 160 is disposed at a rear end of the first valve 140 in a flow path of the fluid flowing through the main flow path 121. For example, when the second valve 160 is open, the first valve 140 is closed. In this case, when the second valve 160 is open for purging or discharging, the first valve 140 is closed. However, since the first valve 140 is disposed at an upstream side of the second valve 160 in the flow path of the fluid, a dead zone may be reduced.

In more detail, in a case in which a downstream valve is disposed at a downstream side of the diverter valve in the flow path of the fluid, or the downstream valve is disposed parallel to the diverter valve, a dead zone may be formed on a flow path connected to the downstream valve among flow paths connected to the main flow path.

For example, when the downstream valve is closed and the diverter valve is open, a fluid flows on the flow path connected to the diverter valve by a convection flow, and the fluid flows by diffusion on the flow path connected to the downstream valve. However, since the flow velocity of the fluid due to convection is faster than the flow velocity of the fluid due to diffusion, a dead zone is formed in the region in which the fluid flows due to diffusion.

Thus, in a case in which the downstream valve is located downstream of the diverter valve, in the flow path of the fluid, or in a case in which the downstream valve is disposed parallel to the diverter valve, the dead zone increases so that a purging time of the remaining gas from the dead zone increases. In this case, reactive gas may fill a flow path connected to the downstream valve, for example, a dead zone, and sufficient time may be required to purge or discharge the reactive gas. Therefore, there is a problem in which productivity may be lowered.

In an exemplary embodiment, since the second valve 160 is disposed at the rear end of the first valve 140 in the flow path of the fluid flowing through the main flow path 121, a dead zone may be reduced, as compared with the case in which the first valve 140 is disposed at a downstream side of the second valve 160, or the first valve 140 is disposed parallel to the second valve 160. For example, as illustrated in FIG. 2, since a dead zone may occur only at the first connection passage 122 and the inlet flow path 141 of the first valve 140, the size of the dead zone may be reduced, as compared with a dead zone occurring if the first valve 140 is disposed at the downstream side of the second valve 160 in the fluid flow path or the first valve 140 is disposed parallel to the second valve 160. In an exemplary embodiment, the first valve 140 for supplying a fluid to a process chamber is arranged at an upstream side of the second valve 160 for purging a remaining fluid of the fluid from the dead zone.

Although the example embodiment illustrates that the first and second valves 140 and 160 are provided on the valve block 120 by way of example, the number of the valves installed on the valve block 120 is not limited thereto.

Also, the number of flow paths of the valve block 120 may also be changed.

Figure 3:
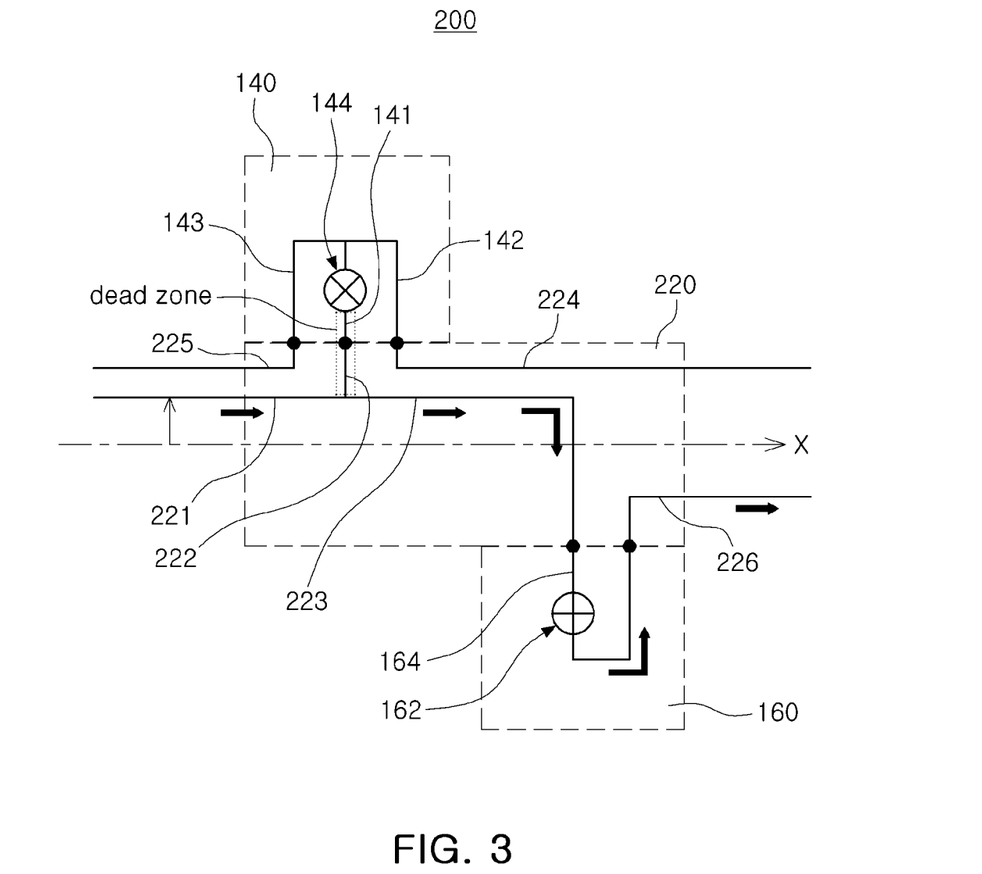
FIG. 3 is a schematic view illustrating a valve apparatus according to a second embodiment of the present inventive concept.

FIG. 3 is a schematic view illustrating a valve apparatus according to a second embodiment.

Referring to FIG. 3, a valve apparatus 200 includes, for example, a valve block 220, a first valve 140, and a second valve 160.

Since the first valve 140 and the second valve 160 are substantially the same as those described in the first embodiment, a detailed description thereof will be omitted.

A plurality of flow paths are formed in the valve block 220, and the valve block 220 may have a hexahedral shape, for example. The first valve 140 and the second valve 160 are installed on the valve block 220. As an example, in the valve block 220, a main flow path 221 is provided, through which a fluid may be supplied to a process chamber. The main flow path 221 branches in the valve block 220. For example, a first connection passage 222 branching from the main flow path 221 is connected to the first valve 140, and a second connection passage 223 branching from the main flow path 221 is connected to the second valve 160.

In addition, in the valve block 220, a first-first flow path 224 and a first-second flow path 225 may be provided to be connected to the first valve 140. In addition, in the valve block 220, a second-first flow path 226 is provided to be connected to the second valve 160. The second-first flow path 226 may be connected to a waste gas treatment system (not shown here) to safely remove a purged gas delivered through the second valve 260. For example, the waste gas treatment system may include a burn/wet system, a gas scrubber or an electrostatic filter.

At least one of the first-first flow path 224 and the first-second flow path 225 may be connected to a process chamber (not shown).

The main flow path 221 is disposed parallel to an axis passing through a center of the valve block 220 and passing through two opposing surfaces of the valve block 220 to be perpendicular thereto, for example, an X axis. For example, the main flow path 221 is disposed to be offset from the X-axis toward the first valve 140. Thus, a length of the first connection passage 222 for connecting the main flow path 221 and the first valve 140 to each other may be reduced.

In more detail, in the case in which the main flow path 221 is disposed on an axis, for example, the X axis, passing through the center of the valve block 220 and passing through two opposing surfaces of the valve block 220 perpendicularly thereto, the length of the first connection passage 222 connected to the main flow path 221 may be relatively great, as compared to that in the case in which the main flow path 221 is disposed to be offset from the X axis toward the first valve 140. Thus, in the case in which the main flow path 221 is disposed on the axis, for example, the X axis, passing through the center of the valve block 220 and passing through two opposing surfaces of the valve block 220 perpendicularly thereto, as the length of the first connection passage 222 connected to the main flow path 221 increases and a dead zone may be relatively increased, as compared with a dead zone in the case in which the main flow path 221 is disposed to be offset from the X axis toward the first valve 140.

However, to reduce the dead zone by reducing the length of the first connection passage 222, the main flow path 221 is disposed parallel to an axis, for example, the X axis, passing through the center of the valve block 220 and passing through two opposing surfaces of the valve block 220 perpendicularly thereto, and simultaneously therewith, is disposed to be offset from the X-axis toward the first valve 140.

As described above, since the second valve 160 is disposed at a rear end of the first valve 140 in the flow path of the fluid flowing through the main flow path 221, the dead zone may be reduced. Further, the main flow path 221 is disposed to be offset from the X-axis toward the first valve 140. Thus, the length of the first connection passage 222 for a connection of the main flow path 221 to the first valve 140 may be reduced. Thus, the dead zone may be further reduced.

Figure 4:
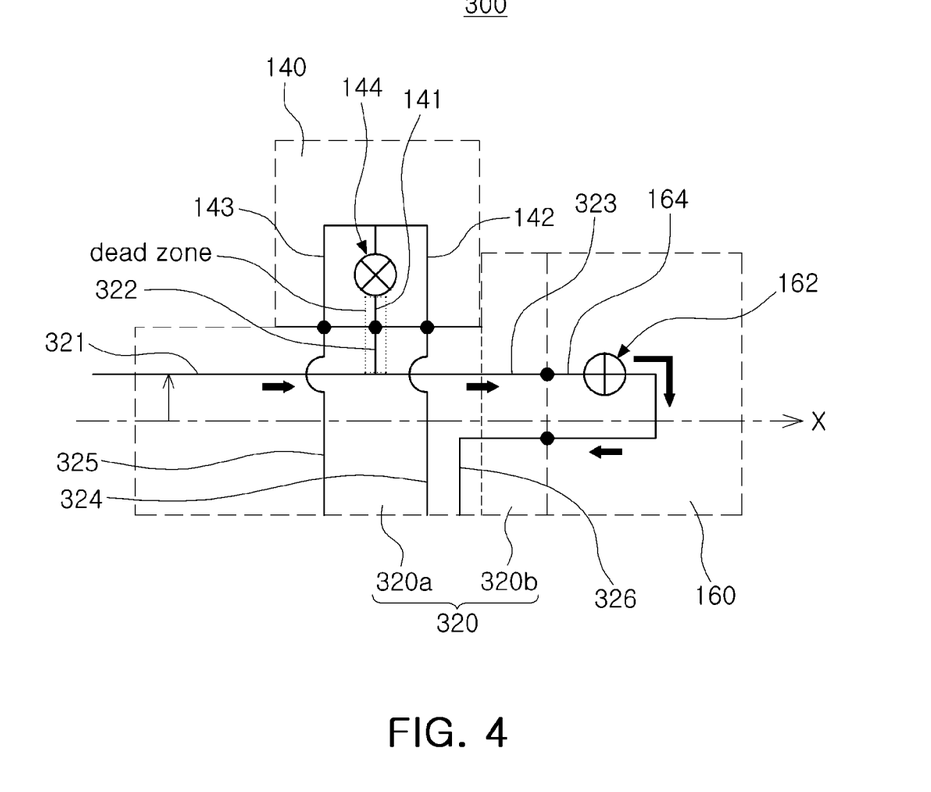
FIG. 4 is a schematic view illustrating a valve apparatus according to a third embodiment of the present inventive concept.
Figure 5:
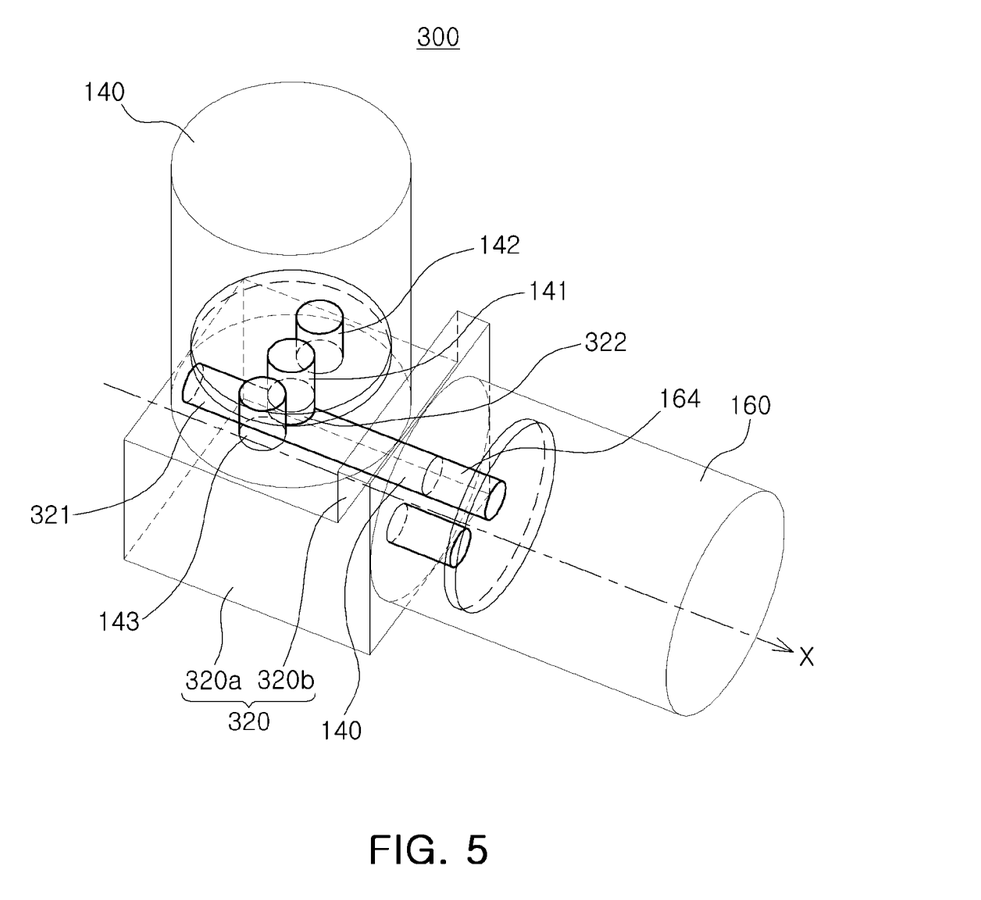
FIG. 5 is a configuration diagram illustrating the valve apparatus according to the third embodiment of the present inventive concept.

FIG. 4 is a schematic view illustrating a valve apparatus according to a third embodiment, and FIG. 5 is a configuration diagram illustrating a valve apparatus according to the third embodiment.

Referring to FIGS. 4 and 5, a valve apparatus 300 includes a valve block 320, a first valve 140, and a second valve 160, for example. The valve block 320 includes a block body 320a having a substantially rectangular parallelepiped shape and a mounting plate portion 320b disposed on the block body 320a.

A plurality of flow paths are formed in the valve block 320. As an example, in the valve block 320, a main flow path 321 is provided, through which a fluid may be supplied to a process chamber (not shown). The main flow path 321 branches in the valve block 320. A first connection passage 322 branching from the main flow path 321 is connected to the first valve 140, and a second connection passage 323 branching from the main flow path 321 is connected to the second valve 160.

In the valve block 320, a first-first flow path 324 and a first-second flow path 325 are provided to be connected to the first valve 140. In addition, in the valve block 320, a second-first flow path 326 is provided to be connected to the second valve 160. The second-first flow path 326 may be connected to a waste gas treatment system (not shown here) to safely remove a purged gas delivered through the second valve 160. For example, the waste gas treatment system may include a burn/wet system, a gas scrubber or an electrostatic filter.

At least one of the first-first flow path 324 and the first-second flow path 325 may be connected to a process chamber (not shown).

The main flow path 321 is disposed parallel to an axis, for example, an X axis, passing through the center of the valve block 320 and passing through two opposing surfaces of the valve block 320 perpendicularly thereto. As an example, the main flow path 321 is disposed to be offset from the X axis toward the first valve 140. Thus, a length of the first connection passage 322 for a connection of the main flow path 321 to the first valve 140 may be reduced.

The first valve 140 and the second valve 160 are installed on the valve block 320. For example, the valve block 320 includes a block body 320a having a substantially rectangular parallelepiped shape and a mounting plate portion 320b disposed on one end of the block body 320a. The first valve 140 is installed on one surface of the block body 320a, and the second valve 160 is installed on the mounting plate portion 320b. A transversal cross-sectional area of the mounting plate portion 320b is larger than a transversal cross-sectional area of the block body 320a.

In addition, the block body 320a and the mounting plate portion 320b may be integrally formed or separately manufactured to be coupled to each other. For example, the block body 320a and the mounting plate portion 320b that are integrally formed may be integrally connected to each other.

Since the mounting plate portion 320b is provided in the valve block 320 as described above, even when the main flow path 321 is disposed parallel to the X axis and disposed to be offset from the X axis toward the first valve 140, the second valve 160 may be easily installed. For example, the second valve 160 may be connected to the second connection passage 323 without using additional connections.

The first and second valves 140 and 160 are the same as those described in the first embodiment, except for installation positions thereof, and a detailed description thereof will be omitted.

Figure 6:
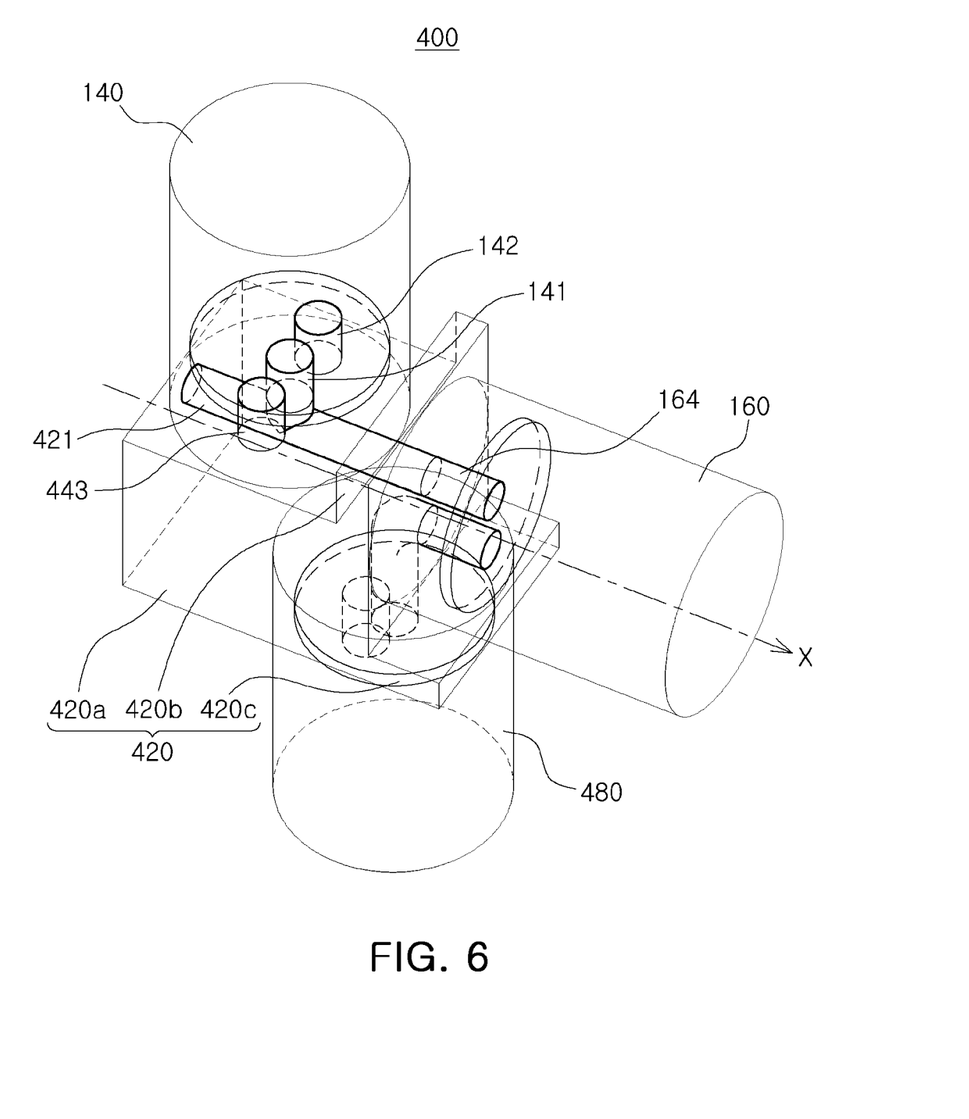
FIG. 6 is a configuration diagram illustrating a valve apparatus according to a fourth embodiment of the present inventive concept.

FIG. 6 is a configuration diagram illustrating a valve apparatus according to a fourth embodiment.

Referring to FIG. 6, a valve apparatus 400 includes, for example, a valve block 420, a first valve 140, a second valve 160, and a third valve 480.

The valve block 420 is provided with the first, second and third valves 140, 160 and 480 disposed thereon. For example, the valve block 420 includes a block body 420*a* having a substantially hexahedral shape, a first mounting plate portion 420*b* disposed on one side of the block body 420*a*, and a second mounting plate portion 420*c* disposed on a lower portion of the block body 420*a*.

The first valve 140 is installed on an upper surface of the block body 420*a*, the second valve 160 is installed on the first mounting plate portion 420*b*, and the third valve 480 is mounted on the second mounting plate portion 420*c*.

In addition, in the valve block 420, a main flow path 421 is provided, through which a fluid may be supplied to a process chamber. The main flow path 421 is disposed parallel to an axis, for example, an X axis, passing through a center of the valve block 420 and passing through two opposing surfaces of the valve block 420 perpendicularly thereto, and is disposed to be offset from the X axis toward the first valve 140.

As described above, even when the main flow path 421 is disposed to be offset from the X axis and three or more valves are disposed on the valve block 420, the second valve 160 and the third valve 480 may be easily installed through the first mounting plate portion 420*b* and the second mounting plate portion 420*c*, respectively.

Figure 7:
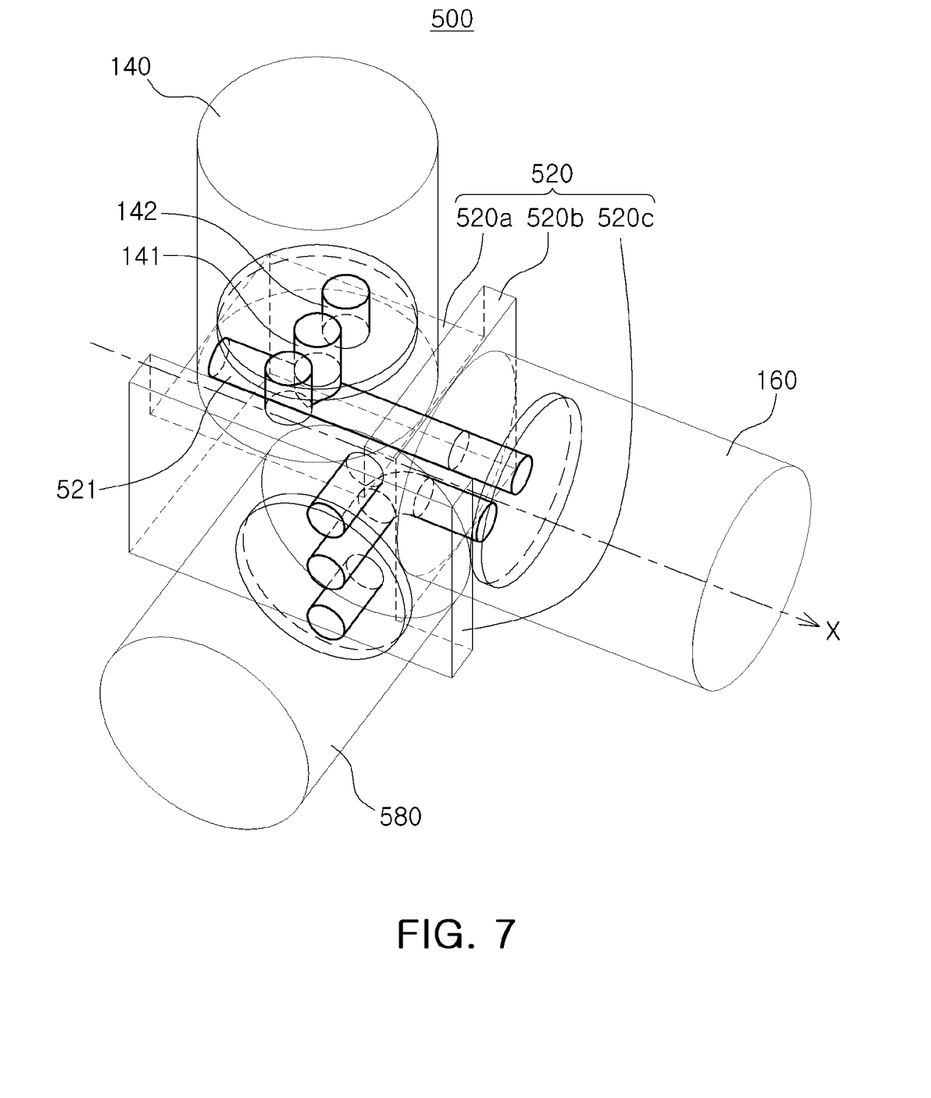
FIG. 7 is a configuration diagram illustrating a valve apparatus according to a fifth embodiment of the present inventive concept.

FIG. 7 is a configuration diagram illustrating a valve apparatus according to a fifth embodiment.

Referring to FIG. 7, a valve apparatus 500 includes a valve block 520, a first valve 140, a second valve 160, and a third valve 580, for example.

The valve block 520 is provided with the first, second and third valves 140, 160 and 580 disposed thereon. For example, the valve block 520 includes a block body 520*a* having a substantially hexahedral shape, a first mounting plate portion 520*b* disposed on one side of the block body 520*a*, and a second mounting plate portion 520*c* disposed on another side of the block body 520*a* adjacent to the one side thereof.

The first valve 140 is installed on an upper surface of the block body 520*a*, the second valve 160 is installed on the first mounting plate portion 520*b*, and the third valve 580 is mounted on the second mounting plate portion 520*c*.

In addition, in the valve block 520, a main flow path 521 is provided, through which a fluid is supplied to a process chamber. The main flow path 521 is disposed parallel to an axis, for example, an X axis, passing through a center of the valve block 520 and passing through two opposing surfaces of the valve block 520 perpendicularly thereto, and is disposed to be offset from the X axis toward the first valve 140.

As described above, even when the main flow path 521 is disposed to be offset from the X axis and three or more valves are disposed on the valve block 520, the second valve 160 and the third valve 580 may be easily installed through the first mounting plate portion 520*b* and the second mounting plate portion 520*c*, respectively.

Figure 8:
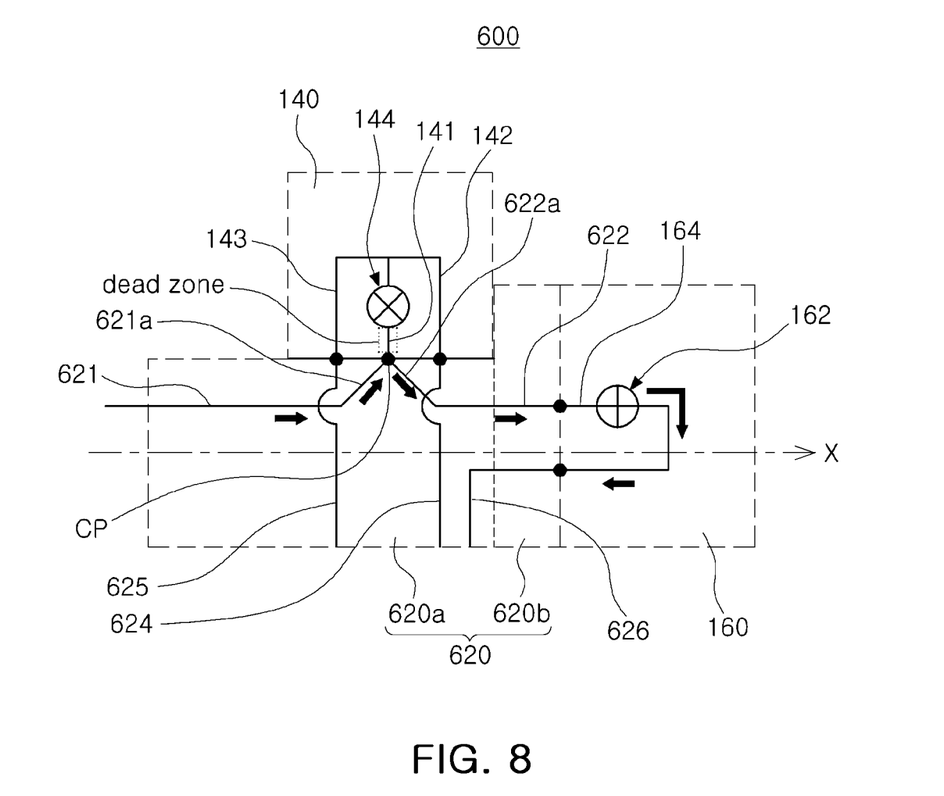
FIG. 8 is a schematic view illustrating a valve apparatus according to a sixth embodiment of the present inventive concept.

FIG. 8 is a schematic view illustrating a valve apparatus according to a sixth embodiment.

Referring to FIG. 8, a valve apparatus 600 includes a valve block 620, a first valve 140, and a second valve 160.

Since the first valve 140 and the second valve 160 are substantially the same as those described in the first embodiment, a detailed description thereof will be omitted.

A plurality of flow paths are formed in the valve block 620. As an example, in the valve block 620, a main flow path 621 is provided, through which a fluid is supplied to a process chamber (not shown). The main flow path 621 is directly connected to the first valve 140. For example, the main flow path 621 is directly connected to an inlet flow path 141 of the first valve 140. A flow path for connection 622 is disposed between the first valve 140 and the second valve 160. For example, one end of the flow path for connection 622 is directly connected to both the main flow path 621 and the inlet flow path 141 and the opposite end of the flow path for connection 622 is directly connected to the second valve 160. The opposite end of the flow path for connection 622 is directly connected to an inlet flow path 164 of the second valve 160.

To this end, the main flow path 621 includes a first main portion and a first extension portion 621*a* for a connection to the inlet flow path 141 of the first valve 140. For example, the first main portion extends in parallel to the X-axis, and the first extension portion 621*a* is disposed to be inclined from the remaining portion of the main flow path 621 (i.e. the first main portion) with respect to X-axis. In this case, however, an example embodiment thereof is not limited thereto. For example, the first extension portion 621*a* may be disposed perpendicularly to the main flow path 621. In addition, the flow path for connection 622 includes a second main portion and a second extension portion 622*a* for a connection to the inlet flow path 141. For example, the second portion extends in parallel to the X-axis, and the second extension portion 622*a* is disposed to be inclined from the remaining portion (i.e., the second main portion) of the flow path for connection 622 with respect to the X-axis.

In the valve block 620, a first-first flow path 624 and a first-second flow path 625 are further provided to be connected to the first valve 140. In addition, in the valve block 620, a second-first flow path 626 is provided to be connected to the second valve 160. The second-first flow path 626 may be connected to a waste gas treatment system (not shown here) to safely remove a purged gas delivered through the second valve 160. For example, the waste gas treatment system may include a burn/wet system, a gas scrubber or an electrostatic filter.

At least one of the first-first flow path 624 and the first-second flow path 625 may be connected to a process chamber (not shown).

The main flow path 621 includes the first main portion that is disposed parallel to an axis, for example, an X axis, passing through a center of the valve block 620 and passing through two opposing surfaces of the valve block 620 perpendicularly thereto. Further, the first main portion of the main flow path 621 is disposed to be offset from the X-axis toward the first valve 140. Thus, the main flow path 621 is directly connected to the first valve 140 without a dead zone, for example, between the main flow path 621 and the first valve 140.

The first valve 140 and the second valve 160 are installed on the valve block 620. As an example, the valve block 620 includes a block body 620*a* having a substantially rectangular parallelepiped shape, and a mounting plate portion 620*b* disposed on one end of the block body 620*a*. The first valve 140 is installed on one surface of the block body 620*a*, and the second valve 160 is installed on an end of the mounting plate portion 620*b*. A transversal cross-sectional surface of the mounting plate portion 620*b* has an area larger than that of a transversal cross-sectional surface of the block body 620a. In this case, the transversal cross-sectional surface refers to a surface perpendicular to the X-axis of FIG. 6, and indicates a cross section provided by cutting the block body 620a and the mounting plate portion 620b in a perpendicular direction to the X-axis.

In addition, the block body 620a and the mounting plate portion 620b may be integrally formed or separately manufactured to be coupled to each other. For example, the block body 620a and the mounting plate portion 620b that are integrally formed may be integrally connected to each other.

Since the mounting plate portion 620b is provided in the valve block 620 as described above, even when the main flow path 621 and the flow path for connection 622 are disposed parallel to the X-axis and is disposed to be offset from the X-axis toward the first valve 140, the second valve 160 may be easily installed. For example, the second valve 160 may be connected to the flow path for connection 622 without using additional connections.

In addition, the main flow path 621 is directly connected to the inlet flow path 141 of the first valve 140, and the flow path for connection 622 extending from a connection portion CP between the main flow path 621 and the inlet flow path 141 is directly connected to the second valve 160, thereby further reducing a dead zone. For example, at the connection portion CP, the first extension portion 621a, the second extension portion 622a and the inlet flow path 141 are connected to each other.

Figure 9:
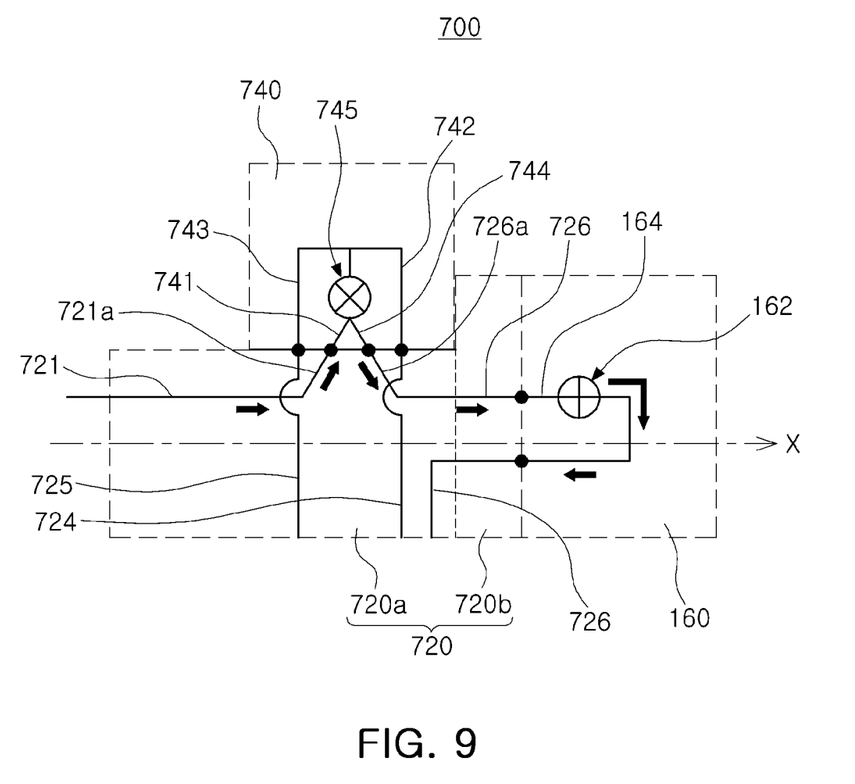
FIG. 9 is a schematic view illustrating a valve apparatus according to a seventh embodiment of the present inventive concept.

FIG. 9 is a schematic view illustrating a valve apparatus according to a seventh embodiment.

Referring to FIG. 9, a valve apparatus 700 includes a valve block 720, a first valve 740, and a second valve 160.

Since the second valve 160 is substantially the same as that described in the first embodiment, a detailed description thereof will be omitted.

A plurality of flow paths are formed in the valve block 720. As an example, in the valve block 720, a main flow path 721 is provided, through which a fluid is supplied to a process chamber (not shown). The main flow path 721 is connected to the first valve 740. For example, the main flow path 721 is directly connected to an inlet flow path 741 of the first valve 740, which will be described later.

In the valve block 720, a first-first flow path 724 and a first-second flow path 725 are further provided to be connected to the first valve 740. In the valve block 720, a flow path for connection 726 is provided to be connected to the second valve 160. The flow path for connection 726 may be connected to a waste gas treatment system (not shown here) to safely remove a purged gas delivered through the second valve 160. For example, the waste gas treatment system may include a burn/wet system, a gas scrubber or an electrostatic filter. The flow path for connection 726 is connected to a connection passage 744 of the first valve 740, which will be described later.

To this end, the main flow path 721 includes a first main portion and a first extension portion 721a for a connection to the inlet flow path 741 of the first valve 740. For example, the first main portion extends in parallel to the X-axis, and the first extension portion 721a is disposed to be inclined from the remaining portion (i.e., the first main portion) of the main flow path 721 with respect to the X-axis. In this case, however, an example embodiment thereof is not limited thereto. For example, the first extension portion 721a may be disposed perpendicularly to the first main portion of the main flow path 721. In addition, a flow path for connection 726 includes a second main portion and a second extension portion 726a for a connection to the connection passage 744.

The second main portion of the flow path for connection 726 extends in parallel to the X-axis, and the second extension portion 726a is disposed to be inclined from the remaining portion (i.e., the second main portion) of the flow path for connection 726 with respect to the X-axis.

At least one of the first-first flow path 724 and the first-second flow path 725 may be connected to a process chamber (not shown).

The main flow path 721 includes the first main portion that is disposed parallel to an axis, for example, the X axis, passing through a center of the valve block 720 and passing through two opposing surfaces of the valve block 720 perpendicularly thereto. Further, the first main portion of the main flow path 721 is disposed to be offset from the X-axis toward the first valve 740. Thus, the main flow path 721 is directly connected to the first valve 740.

The first valve 740 and the second valve 160 are installed on the valve block 720. As an example, the valve block 720 includes a block body 720a having a substantially rectangular parallelepiped shape and a mounting plate portion 720b disposed on one end of the block body 720a. The first valve 740 is installed on one surface of the block body 720a, and the second valve 160 is installed on the mounting plate portion 720b. A transversal cross-sectional surface of the mounting plate portion 720b is formed to have an area larger than that of a transversal cross-sectional surface of the block body 720a.

In addition, the block body 720a and the mounting plate portion 720b may be integrally formed or separately manufactured to be coupled to each other. For example, the block body 720a and the mounting plate portion 720b that are integrally formed is integrally connected to each other.

Since the mounting plate portion 720b is provided in the valve block 720 as described above, even when the main flow path 721 and the flow path for connection 726 are disposed parallel to the X-axis and disposed to be offset from the X-axis toward the first valve 740, the second valve 160 may be easily installed. For example, the second valve 160 may be connected to the flow path for connection 726 without using additional connections The first valve 740 is installed on the valve block 720 and is connected to the main flow path 721, the first-first flow path 724, and the first-second flow path 725 that are provided in the valve block 720. For example, the first valve 740 includes the inlet flow path 741 connected to the main flow path 721 and outlet flow paths 742 and 743 branching from the end of the inlet flow path 741 to be connected to the first-first flow path 724 and the first-second flow path 725, respectively. The first valve 740 includes the connection passage 744 branching from the inlet flow path 741 to be connected to the flow path for connection 726 that is connected to the second valve 160. As an example, the first valve 740 may be used as a downstream valve. The first valve 740 includes a valve body 745 having a diaphragm (not shown) and an actuator (not shown) as a diaphragm valve. The valve body 745 may serve to connect the inlet flow path 741 to at least one of outlet flow paths 742 and 743 or to prevent the inlet flow path 741 from being connected to the outlet flow paths 742 and 743. For example, when the valve body 745 interrupts the connection between the inlet flow path 741 and the outlet flow paths 742 and 743, the inlet flow path 741 may be connected to the connection passage 744. The inlet flow path 741 may be connected to the connection passage 744 according to an operation mode of the first valve 740. For example, when the first valve 740 turns on to supply a fluid (for example, reactant gases necessary for a process) to a process chamber, the inlet flow path 741 and the connection passage 744 may be disconnected to each other; and when the first valve 740 turns off, the inlet flow path 741 and the connection passage 744 may be connected to each other so that a purging fluid (for example, a flow of Ar gas) may flow from the main flow path 721 via the second valve 160 to an external.

As described above, even when the fluid flows to the second valve 160, the fluid flows along the inlet flow path 741 and the connection passage 744 of the first valve 740. Thus, a dead zone may be eliminated.

Figure 10:
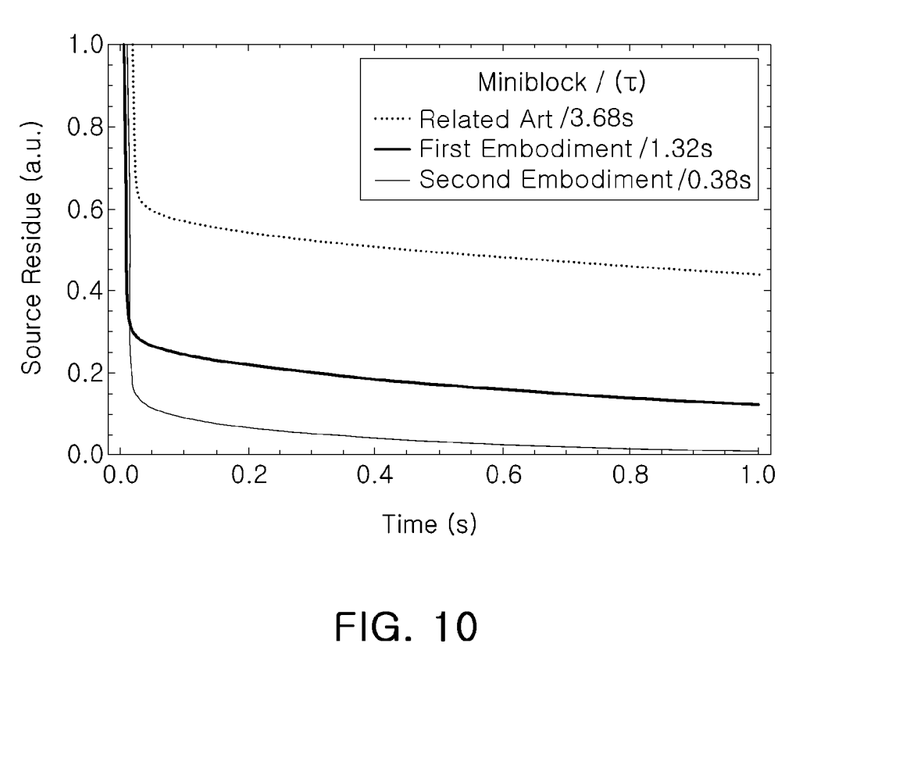
FIG. 10 is a graph illustrating the effect of valve apparatuses according to the related art and example embodiments of the present inventive concept.

FIG. 10 is a graph illustrating the effect of valve apparatuses according to the related art and an example embodiment of the present inventive concept.

FIG. 10 illustrates a result obtained by numerically simulating the residual amount of a fluid when discharging the fluid remaining in the main flow path through a second valve therefrom. As illustrated in FIG. 10, the discharge due to convection is dominant at the beginning of the operation, and the fluid remaining in a dead zone is gradually discharged over time.

As illustrated in FIG. 10, a time constant of a reduction in a residual amount evaluated as diffusion-dominant data after 0.05 second is 3.68 second in the related art, is 1.32 second in the first embodiment, and is 0.38 second in the third embodiment.

In this case, the time constant refers to the time required to remove a trapped gas in the dead zone by $(1-(1/e))$, which is approximately 0.632, of the initial residual amount.

As described above, the residual amount due to the dead zone is remarkably reduced as compared with the related art.

As set forth above, according to an example embodiment, a valve apparatus in which a dead zone may be reduced is provided.

While example embodiments have been shown and described above, it will be apparent to those skilled in the art that modifications and variations could be made without departing from the scope of the present inventive concept as defined by the appended claims.

What is claimed is:

1. A valve apparatus comprising:
a valve block that is provided with a main flow path;
a first valve installed on a first side surface of the valve block and connected to the main flow path; and
a second valve installed on the valve block and connected to the main flow path,
wherein the main flow path is disposed parallel to a central axis passing through a center of the valve block and passing through two opposite surfaces of the valve block,
wherein each of the two opposite surfaces of the valve block is connected perpendicularly to the first side surface of the valve block, and
wherein the main flow path is disposed to be offset from the central axis toward the first valve and is disposed between the first side surface of the valve block and the central axis.

2. The valve apparatus of claim 1,
wherein when the first valve turns on, a first fluid is supplied from the main flow path to a process chamber via the first valve, and when the first valve turns off and the second valve turns on, a second fluid is supplied from the main flow path to a waste gas treatment system via the second valve.

3. The valve apparatus of claim 1,
wherein the first valve is connected to the main flow path and an upstream side of the second valve.

4. The valve apparatus of claim 3,
wherein the valve block is provided with a first connection passage and a second connection passage, a first end of the first connection passage is directly connected to the first valve and a second end of the first connection passage is directly connected to both the main flow path and a first end of the second connection passage, and a second end of the second connection passage is directly connected to the second valve.

5. The valve apparatus of claim 4,
wherein the first valve is disposed on a third surface of the valve block, the second valve is disposed on a fourth surface opposing the third surface of the valve block, and the third surface and the fourth surface are in parallel to the central axis.

6. The valve apparatus of claim 4,
wherein the valve block comprises a block body including a first surface and a second surface, and a mounting plate portion including a connection surface connected to the second surface, the mounting plate portion having a cross section wider than a cross section of the block body.

7. The valve apparatus of claim 6,
wherein the block body further includes a third surface connecting the first surface to the second surface, the third surface being in parallel to the central axis, the first valve is installed on the third surface of the block body, and the second valve is installed on a mounting surface of the mounting plate portion that is opposite to the connection surface thereof.

8. The valve apparatus of claim 7,
wherein the second valve includes an inlet flow path connected to the second connection passage, each of the inlet flow path and the second connection passage extends in parallel to a longitudinal direction of the main flow path, and the inlet flow path is disposed on an imaginary line extending along the longitudinal direction of the main flow path.

9. The valve apparatus of claim 6,
wherein the block body and the mounting plate portion are integrally connected to each other.

10. The valve apparatus of claim 3,
wherein the main flow path comprises a first main portion and a first extension portion, the first extension portion of the main flow path is directly connected to both the first valve and the first main portion, the first main portion extends in parallel to the central axis, and the valve block is further provided with a flow path for connection that is directly connected to the second valve.

11. The valve apparatus of claim 10,
wherein the first valve includes an inlet flow path, and
wherein the first extension portion extends from an end of the first main portion and is directly connected to the inlet flow path of the first valve, and the first extension portion is disposed to be inclined with respect to the central axis.

12. The valve apparatus of claim 11,
wherein the flow path for connection has a second main portion and a second extension portion, the second extension portion is directly connected to the inlet flow path of the first valve, the second main portion extends in parallel to the central axis, and the second extension portion is disposed to be inclined with respect to the central axis.

13. The valve apparatus of claim 11,
wherein the first valve further includes a connection passage directly connected to the flow path for connection, and
wherein the inlet flow path and the connection passage, if the first valve is turned off, are directly connected to each other and if the first valve is turned on, are disconnected to each other.

14. The valve apparatus of claim 13,
wherein the flow path for connection has a second main portion and a second extension portion, the second extension portion extends from an end of the second main portion and is directly connected to the connection passage of the first valve, the second main portion extends in parallel to the central axis, and the second extension portion is disposed to be inclined with respect to the central axis.

15. A valve apparatus comprising:
a valve block including a main flow path;
a first valve, installed on the valve block, selectively supplying a first fluid from the main flow path to a process chamber;
a second valve installed on the valve block, wherein the first valve is connected to the main flow path and an upstream side of the second valve; and
a flow path for connection arranged in the upstream side of the second valve,
wherein the first valve is directly connected to both the main flow path and the flow path for connection,
wherein the flow path for connection, connects the main flow path and the second valve to each other, and
wherein the main flow path is connected to the second valve through the flow path for connection such that a second fluid flowing from the main flow path to the second valve purges a remaining fluid of the first fluid in the main flow path and the first vale.

16. The valve apparatus of claim 15,
wherein the main flow path is disposed parallel to a central axis passing through a center of the valve block and passing through two opposing surfaces of the valve block perpendicularly thereto, and the main flow path is disposed to be offset from the central axis toward the first valve.

17. The valve apparatus of claim 16,
wherein the main flow path comprises a first main portion and a first extension portion, the first valve includes an inlet flow path, the first extension portion extends from an end of the first main portion to be directly connected to the inlet flow path of the first valve, the first main portion extends in parallel to the central axis, and the first extension portion is disposed to be inclined with respect to the central axis.

18. The valve apparatus of claim 16,
wherein the valve block comprises a block body having a first surface, a second surface and a third surface connecting the first surface to the second surface, and a mounting plate portion having a cross section wider than a cross section of the block body, the first valve is installed on the third surface of the block body, the mounting plate portion is disposed on the second surface of the valve block, and the second valve is installed on the mounting plate portion,
wherein the second valve includes an inlet flow path extending in parallel to a longitudinal direction of the main flow path and being directly connected to the flow path for connection, and
wherein the inlet flow path is disposed on an imaginary line extending along the longitudinal direction of the main flow path.

19. A valve apparatus comprising:
a valve block having a main flow path;
a first valve installed on the valve block, wherein a fluid is selectively supplied via the first valve from the main flow path to a process chamber; and
a second valve installed on the valve block,
wherein a remaining gas of the fluid in the first valve, after the first valve turns off, is discharged via the second valve to a waste gas treatment system,
wherein the first valve is connected to the main flow path and an upstream side of the second valve,
wherein the first valve is connected to the main flow path and an upstream side of the second valve, and
wherein the valve block is provided with a first connection passage and a second connection passage, a first end of the first connection passage is directly connected to the first valve and a second end of the first connection passage is directly connected to both the main flow path and a first end of the second connection passage, and a second end of the second connection passage is directly connected to the second valve.

* * * * *